(12) United States Patent
Dadvand et al.

(10) Patent No.: US 10,424,552 B2
(45) Date of Patent: Sep. 24, 2019

(54) ALLOY DIFFUSION BARRIER LAYER

(71) Applicant: Texas Instruments Incorporated, Dallas, TX (US)

(72) Inventors: Nazila Dadvand, Richardson, TX (US); Salvatore Frank Pavone, Murphy, TX (US); Christopher Daniel Manack, Flower Mound, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/954,254

(22) Filed: Apr. 16, 2018

(65) Prior Publication Data

US 2019/0088608 A1 Mar. 21, 2019

Related U.S. Application Data

(60) Provisional application No. 62/561,070, filed on Sep. 20, 2017.

(51) Int. Cl.
*H01L 23/00* (2006.01)
*C25D 5/12* (2006.01)

(52) U.S. Cl.
CPC .............. *H01L 24/11* (2013.01); *C25D 5/12* (2013.01); *H01L 24/13* (2013.01); *H01L 24/16* (2013.01); *H01L 24/81* (2013.01); *H01L 2224/11462* (2013.01); *H01L 2224/1368* (2013.01); *H01L 2224/13147* (2013.01);
(Continued)

(58) Field of Classification Search
CPC ......... H01L 21/76843; H01L 21/76846; H01L 21/76856; H01L 21/76858; H01L 21/76877; H01L 21/76882; H01L 23/53238; H01L 2924/0002; H01L 2924/00; H01L 2924/01029; H01L 2224/81815; H01L 2224/45147;
(Continued)

(56) References Cited

U.S. PATENT DOCUMENTS 8,901,735 B2  12/2014  Yu et al.
8,922,004 B2  12/2014  Lin et al.
(Continued)

OTHER PUBLICATIONS

International Search Report for PCT/US/2018/051874 dated Jan. 10, 2019, 2 pages.

*Primary Examiner* — Roy K Potter
(74) *Attorney, Agent, or Firm* — Dawn Jos; Charles A. Brill; Frank D. Cimino

(57) ABSTRACT

A microelectronic device includes a reflow structure. The reflow structure has a copper-containing member and a solder member, and a barrier layer between them. The barrier layer has metal grains, with a diffusion barrier filler between the metal grains. The metal grains include at least a first metal and a second metal, each selected from nickel, cobalt, lanthanum, and cerium, with each having a concentration in the metal grains of at least 10 weight percent. The diffusion barrier filler includes at least a third metal, selected from tungsten and molybdenum. A combined concentration of tungsten and molybdenum in the diffusion barrier filler is higher than in the metal grains to provide a desired resistance to diffusion of copper. The barrier layer includes 2 weight percent to 15 weight percent of the combined concentration of tungsten, and molybdenum. A bump bond structure and a lead frame package are disclosed.

20 Claims, 9 Drawing Sheets

(52) U.S. Cl.
CPC ........... *H01L 2224/13582* (2013.01); *H01L 2224/13609* (2013.01); *H01L 2224/13611* (2013.01); *H01L 2224/13613* (2013.01); *H01L 2224/13639* (2013.01); *H01L 2224/13655* (2013.01); *H01L 2224/13657* (2013.01); *H01L 2224/13684* (2013.01); *H01L 2224/13693* (2013.01); *H01L 2224/16503* (2013.01); *H01L 2224/81815* (2013.01); *H01L 2924/01057* (2013.01); *H01L 2924/01058* (2013.01)

(58) Field of Classification Search
CPC . H01L 2224/81455; H01L 2924/01028; H01L 2224/05155; H01L 2224/03
See application file for complete search history.

(56) References Cited

U.S. PATENT DOCUMENTS

| | | |
|---|---|---|
| 9,159,589 B2 | 10/2015 | Lin et al. |
| 9,425,136 B2 | 8/2016 | Kuo et al. |
| 9,748,173 B1* | 8/2017 | Murray ............. H01L 21/76826 |
| 2007/0023919 A1 | 2/2007 | Lin et al. |
| 2011/0254151 A1 | 10/2011 | Lin et al. |
| 2012/0061823 A1 | 3/2012 | Wu et al. |
| 2014/0124924 A1 | 5/2014 | Chang |
| 2016/0268223 A1 | 9/2016 | Burgess et al. |
| 2017/0025381 A1* | 1/2017 | Tsai ................... H01L 25/0657 |
| 2018/0108610 A1* | 4/2018 | Yang ................ H01L 21/76883 |

* cited by examiner

ALLOY DIFFUSION BARRIER LAYER

CROSS-REFERENCE TO RELATED APPLICATIONS

This application claims the benefit of priority under 35 U.S.C. § 119(e) of U.S. Provisional Application No. 62/561,070 (Texas Instruments docket number TI-78713PS), filed Sep. 20, 2017, which is hereby incorporated by reference in its entirety.

FIELD OF THE DISCLOSURE

This disclosure relates to the field of microelectronic devices. More particularly, this disclosure relates to barrier layers in microelectronic devices.

BACKGROUND OF THE DISCLOSURE

Many microelectronic devices have bump bond structures with copper pillars and solder bumps on the copper pillars, to provide connections to lead frames and other package terminals. Increasing demand for miniaturization of the copper pillars and higher pillar densities has increased the current density through the copper pillars and the solder bumps. Electromigration failure in bump bond structures with solder directly contacting the copper pillars has been attributed to the depletion of intermetallic compounds at the interface of the copper and the solder, which usually contains tin. These failures have led to use of barrier layers between the copper and the solder. Nickel, nickel phosphorus, nickel phosphorus tungsten, nickel iron phosphorus, nickel rhenium phosphorus, cobalt phosphorus, and cobalt tungsten phosphorus, have been reported as potential candidates for the barrier layers. Each of these layers suffer from disadvantages. Nickel forms a brittle intermetallic compound of $Ni_3Sn_4$ which can pose reliability issues. Even though a thin nickel layer on copper can reduce the interfacial reactions with tin-rich solders at a low reflow temperature, it may not be so effective when a reflow process is performed at a higher temperature and for a longer period. The remaining proposed barrier layer compositions react with tin-rich solder, leading to formation of brittle intermetallic compounds, resulting in fractures or voids in the bump bond structure.

SUMMARY OF THE DISCLOSURE

The present disclosure introduces a microelectronic device having a reflow structure with a copper-containing member and a solder member, and a barrier layer between the copper-containing member and the solder member. The barrier layer has metal grains, and a diffusion barrier filler between the metal grains.

The metal grains include at least a first metal and a second metal having a concentration in the metal grains of at least 10 weight percent each. The first metal and the second metal are selected from nickel, cobalt, lanthanum, and cerium. A combined concentration of nickel, cobalt, lanthanum, and cerium in the metal grains is at least 85 weight percent.

The barrier layer includes at least a third metal, selected from tungsten and molybdenum. The barrier layer includes at least 2 weight percent and less than 15 weight percent of the combined concentration of tungsten, and molybdenum. A combined concentration of tungsten and molybdenum in the diffusion barrier filler is higher than a combined concentration of tungsten and molybdenum in the metal grains.

In one aspect, the reflow structure may be manifested as a bump bond structure wherein the copper-containing member may be manifested as a copper-containing pillar, and the solder member may be manifested as a solder bump. In another aspect, the reflow structure may be manifested as a lead frame package wherein the copper-containing member may be manifested as a copper-containing lead frame terminal, and solder member may be manifested as a solder layer.

The barrier layer may be formed by concurrently plating the first metal, the second metal, and the third metal onto the copper-containing member. The third metal diffuses out of interiors of the metal grains to accumulate in the diffusion barrier filler between the metal grains.

DETAILED DESCRIPTION OF EXAMPLE EMBODIMENTS

Figure 1:
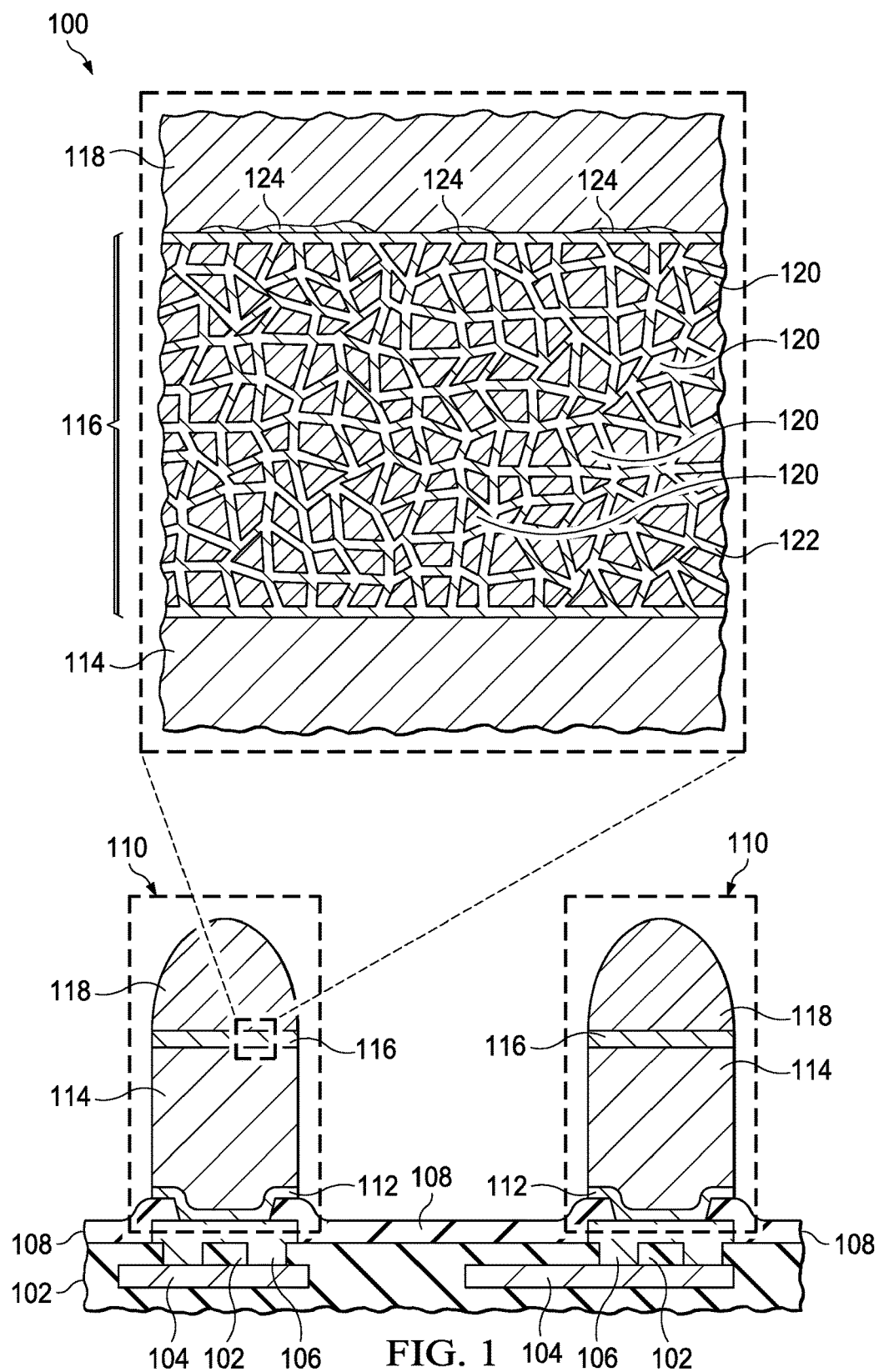
FIG. 1 is a cross section of an example microelectronic device including a copper-containing pillar, a barrier layer, and a solder bump.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device includes a reflow structure, which may be, for example, a bump bond structure, or a lead frame package. The reflow structure has a copper-containing member and a solder member, and a barrier layer between the copper-containing member and the solder member. The barrier layer has metal grains, with a diffusion barrier filler between the metal grains. The solder member may include tin, along with other metals such as bismuth, indium, or silver. The solder member has a reflow temperature between 150° C. and 400° C. The solder member may include at least 25 weight percent tin to provide a desired reflow temperature and desired properties such as hardness and electrical conductivity.

The metal grains include at least a first metal and a second metal, with each having a concentration in the metal grains of at least 10 weight percent each. The first metal and the second metal are selected from nickel, cobalt, lanthanum, and cerium. The metal grains may include additional metals from the nickel, cobalt, lanthanum, and cerium group. A combined concentration of nickel, cobalt, lanthanum, and cerium in the metal grains is at least 85 weight percent. The metal grains may form mixed tin intermetallic compounds that are more ductile than $Ni_3Sn_4$, advantageously reducing reliability problems.

The barrier layer includes at least 2 weight percent of a third metal, selected from tungsten and molybdenum. The barrier layer may include both tungsten and molybdenum. A combined concentration of tungsten and molybdenum in the diffusion barrier filler is higher than a combined concentration of tungsten and molybdenum in the metal grains to provide a desired resistance to diffusion of copper. The barrier layer includes less than 15 weight percent of the combined concentration of tungsten and molybdenum. Having at least 2 weight percent of tungsten and molybdenum in the barrier layer may advantageously provide that the diffusion barrier filler reduces diffusion of copper through the barrier layer compared to an equal thickness of nickel. Having less than 15 weight percent of tungsten and molybdenum maintains an electrical conductivity of the barrier layer above a desired value.

One example is disclosed herein in which the reflow structure may be manifested as a bump bond structure, the copper-containing member may be manifested as a copper-containing pillar, and the solder member may be manifested as a solder bump. Another example is disclosed herein in which the reflow structure may be manifested as a lead frame package wherein the copper-containing member may be manifested as a copper-containing lead frame terminal, and solder member may be manifested as a solder layer. Other manifestations of the reflow structure with the barrier layer are within the scope of this disclosure.

The barrier layer may be formed by concurrently plating the first metal, the second metal, and the third metal onto the copper-containing member. The third metal diffuses out of interiors of the metal grains to accumulate in the diffusion barrier filler between the metal grains.

For the purposes of this disclosure, it will be understood that, if an element is referred to as being on another element, it may be directly on the other element, or intervening elements may be present.

FIG. 1 is a cross section of an example microelectronic device including a copper-containing pillar, a barrier layer, and a solder bump. The microelectronic device 100 includes a dielectric layer 102, which may include one or more dielectric sublayers of silicon dioxide, silicon nitride, or similar dielectric material. The microelectronic device 100 includes interconnects 104 in the dielectric layer 102. The interconnects 104 may be parts of a top interconnect level, or may be parts of a redistribution layer. Bond pads 106 of the microelectronic device 100 are electrically coupled to the interconnects 104. The bond pads 106 may include aluminum, copper, nickel, or other metal suitable for bond pads. A protective overcoat (PO) layer 108 is located on the dielectric layer 102. The PO layer 108 exposes at least a portion of each bond pad 106. The PO layer 108 may include one or more layers of silicon dioxide, silicon nitride, silicon oxynitride, polyimide, aluminum oxide, or other dielectric material providing a barrier to water vapor and other contaminants.

The microelectronic device 100 includes bump bond structures 110 on the bond pads 106. Each bump bond structure 110 includes an under bump metallization (UBM) layer 112 which makes electrical contact to the corresponding bond pad 106. The UBM layer 112 may include titanium, nickel, palladium, copper, or other metals suitable for a metal layer providing adhesion to the bond pad 106 and a plating surface for the bump bond structures 110.

Each bump bond structure 110 further includes a copper-containing pillar 114, referred to herein as the copper pillar 114, on the corresponding UBM layer 112. The copper pillar 114 may include primarily copper with a few percent other elements, or may consist essentially of copper.

Each bump bond structure 110 includes a barrier layer 116 coupled to the corresponding copper pillar 114, and a solder bump 118 of solder coupled to the barrier layer 116, so that the barrier layer 116 separates the copper pillar 114 from the solder bump 118. The solder bump 118 includes metals which provide a reflow temperature between 150° C. and 400° C. For example, the solder bump 118 may include tin, and may include other metals such as bismuth, indium, or silver. Lead has previously been used in solder bumps, but at the time of this disclosure, lead is generally not used in solder bumps due to health and environmental concerns.

The barrier layer 116 may be, for example, 2 microns to 20 microns thick, to provide a desired balance between isolation of the copper from the metals in the solder bump and a fabrication cost and complexity of the bump bond structures 110. The barrier layer 116 includes metal grains 120 and a diffusion barrier filler 122 between the metal grains 120. The metal grains 120 include at least a first metal and a second metal, selected from nickel, cobalt, lanthanum, and cerium. The first metal and the second metals each have a concentration in the metal grains 120 of at least 10 weight percent each. The metal grains 120 may include any combination of nickel, cobalt, lanthanum, and cerium. A combined concentration of nickel, cobalt, lanthanum, and cerium in the metal grains 120 is at least 85 weight percent. Different compositions of the metal grains 120 may be selected to provide desired balances between reliability and fabrication cost. For example, the metal grains 120 may include at least 10 weight percent nickel and at least 10 weight percent cobalt, and less than 1 weight percent lanthanum and cerium.

The barrier layer 116 includes a third metal, selected from tungsten and molybdenum. The diffusion barrier filler may include both tungsten and molybdenum. A combined concentration of tungsten and molybdenum in the diffusion barrier filler 122 is higher than a combined concentration of tungsten and molybdenum in the metal grains 120. The barrier layer 116 includes at least 2 weight percent and less than 15 weight percent total concentration of tungsten, and molybdenum. Different compositions of the diffusion barrier filler 122 may be selected to provide desired balances between reliability and fabrication cost. For example, the diffusion barrier filler 122 may include tungsten, with very little molybdenum.

The barrier layer 116 may provide two advantages for the microelectronic device 100. First, the metal grains 120 may combine with tin in the solder bump 118 to form mixed tin intermetallic compounds 124, precluding or reducing formation of the brittle tin-nickel intermetallic compound $Ni_3Sn_4$. The mixed tin intermetallic compounds 124 are more ductile than $Ni_3Sn_4$, and thus less prone to breaking and forming voids when the bump bond structure 110 is stressed, advantageously reducing reliability problems. Second, the tungsten or molybdenum in the diffusion barrier filler 122 reduces diffusion of copper through the barrier layer 116; copper has a lower rate of diffusion through the barrier layer 116 than through an equal thickness of nickel.

Figure 2A:
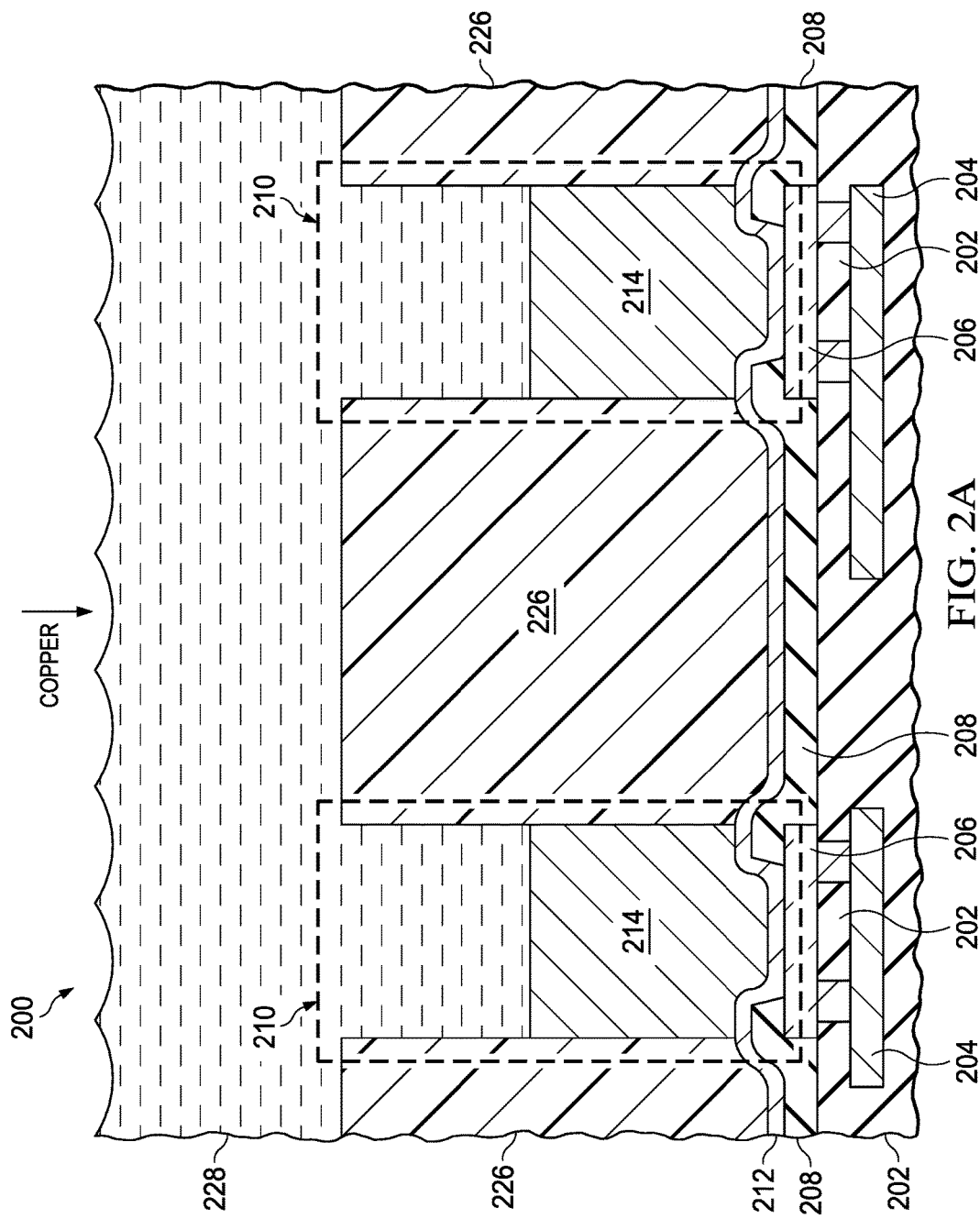
FIG. 2A through FIG. 2E are cross sections of a microelectronic device including a copper-containing pillar, a barrier layer, and a solder bump, depicted in stages of an example method of formation.

FIG. 2A through FIG. 2E are cross sections of a microelectronic device including a copper-containing pillar, a barrier layer, and a solder bump, depicted in stages of an example method of formation. Referring to FIG. 2A, the microelectronic device 200 of the instant example includes a dielectric layer 202, and interconnects 204 in the dielectric layer 202. Bond pads 206 of the microelectronic device 200 are electrically coupled to the interconnects 204. A PO layer 208 is located on the dielectric layer 202, exposing at least a portion of each bond pad 206.

A UBM layer 212 is formed over the PO layer 208 and on the bond pads 206 where exposed by the PO layer 208. The UBM layer 212 may include an adhesion sublayer with titanium or other metal that provides good adhesion to the PO layer 208 and makes a low resistance and reliable electrical connection to the bond pads 206. The UBM layer 212 may further include a seed sublayer on the adhesion sublayer; the seed sublayer may include nickel, copper, or other metal to provide a low sheet resistance layer for a subsequent plating operation. The UBM layer 212 may be formed by sequential sputtering processes, for example.

A plating mask 226 is formed on the UBM layer 212. The plating mask 226 exposes areas over the bond pads 206 for bump bond structures 210. The plating mask 226 may include photoresist, and may be formed by a photolithographic process. Alternatively, the plating mask 226 may include organic polymers and may be formed by an additive process such as an ink jet process.

The UBM layer 212 is exposed to a copper plating bath 228 which includes copper. Copper may be added to the copper plating bath 228, as indicated in FIG. 2A, in the form of copper sulfate, with an acid to provide a desired conductivity of the copper plating bath 228. Wetting agents, levelers, accelerators, or suppressors may be added to the copper plating bath 228 to provide a desired profile and surface finish. Current is flowed from the copper plating bath 228 to the UBM layer 212, resulting in copper being plated from the copper plating bath 228 onto the UBM layer 212 where exposed by the plating mask 226 to form a copper-containing pillar 214, referred to herein as the copper pillar 214, on the UBM layer 212 in each bump bond structure 210.

Figure 2B:
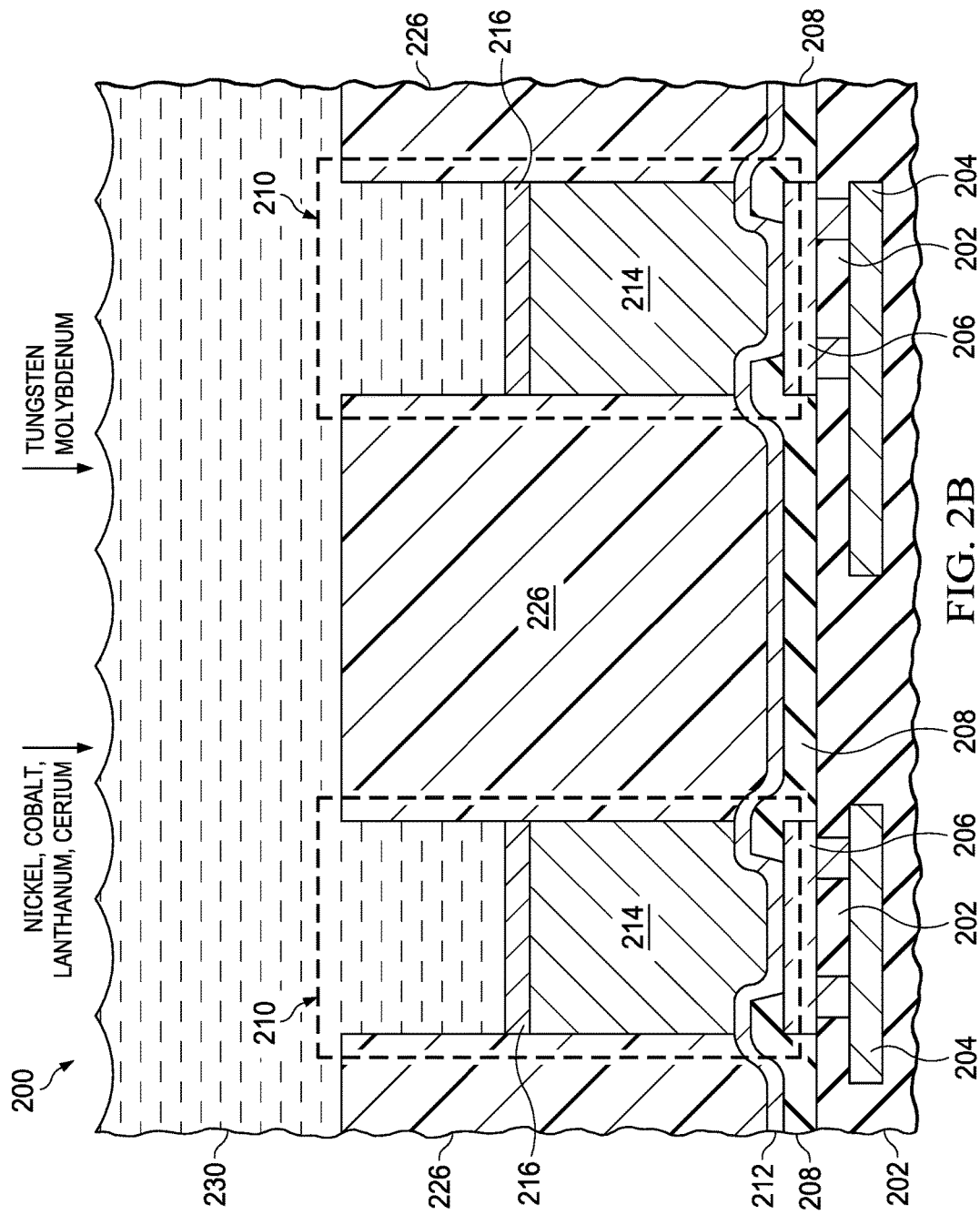

Referring to FIG. 2B, the plating mask 226 is left in place, and the copper pillars 214 are exposed to a barrier plating bath 230. The barrier plating bath 230 includes at least two metals selected from nickel, cobalt, lanthanum, and cerium, and at least one metal selected from tungsten and molybdenum. Nickel may be added to the barrier plating bath 230, as indicated in FIG. 2B, in the form of nickel sulfate. Cobalt may be added to the barrier plating bath 230 in the form of cobalt sulfate. Lanthanum may be added to the barrier plating bath 230 in the form of lanthanum oxide or lanthanum chloride. Cerium may be added to the barrier plating bath 230 in the form of cerium sulfate. Tungsten may be added to the barrier plating bath 230 in the form of sodium tungstate. Molybdenum may be added to the barrier plating bath 230 in the form of sodium molybdate. The barrier plating bath 230 may further include additives such as wetting agents, levelers, accelerators, or suppressors. The metals in the barrier plating bath 230 are plated onto the copper pillars 214 to form a barrier layer 216 on the corresponding copper pillar 214 in each bump bond structure 210. The barrier layer 216 has the composition and structure disclosed in reference to the barrier layer 116 of FIG. 1.

A composition of the barrier plating bath 230 may be selected to provide a desired balance between reliability and fabrication cost. In an example, the barrier plating bath 230 may include nickel and cobalt, and may be essentially free of lanthanum and cerium. In another example, the barrier plating bath 230 may include tungsten, and may be essentially free of molybdenum.

The barrier layer 216 may be formed using a reversed pulse plating process, sometimes referred to as a reverse pulse plating process. During a reversed pulse plating process applied to the barrier plating bath 230, forward current is flowed in one or more forward pulses from the barrier plating bath 230 to the copper pillars 214, plating the metals from the barrier plating bath 230 onto the copper pillars 214 to form a portion of the barrier layers 216, resulting in a partially-formed barrier layer 216. An amplitude and a duration of the forward pulses are selected to provide a desired metal grain size in the partially-formed barrier layer 216. After the forward pulses, reverse current is flowed in one or more reverse pulses from the copper pillars 214 to the barrier plating bath 230, selectively removing the tungsten and molybdenum from the surface of the partially-formed barrier layer 216. An amplitude and a duration of the reverse pulses are selected to remove a desired amount of the tungsten and molybdenum. Tungsten and molybdenum diffuse from interiors of the metal grains in the barrier layer 216 and accumulate to form a diffusion barrier filler between grain boundaries of the metal grains. Thus, the reversed pulse plating process forms the barrier layer 216 with the composition and structure disclosed in reference to the barrier layer 116 of FIG. 1.

Figure 3:
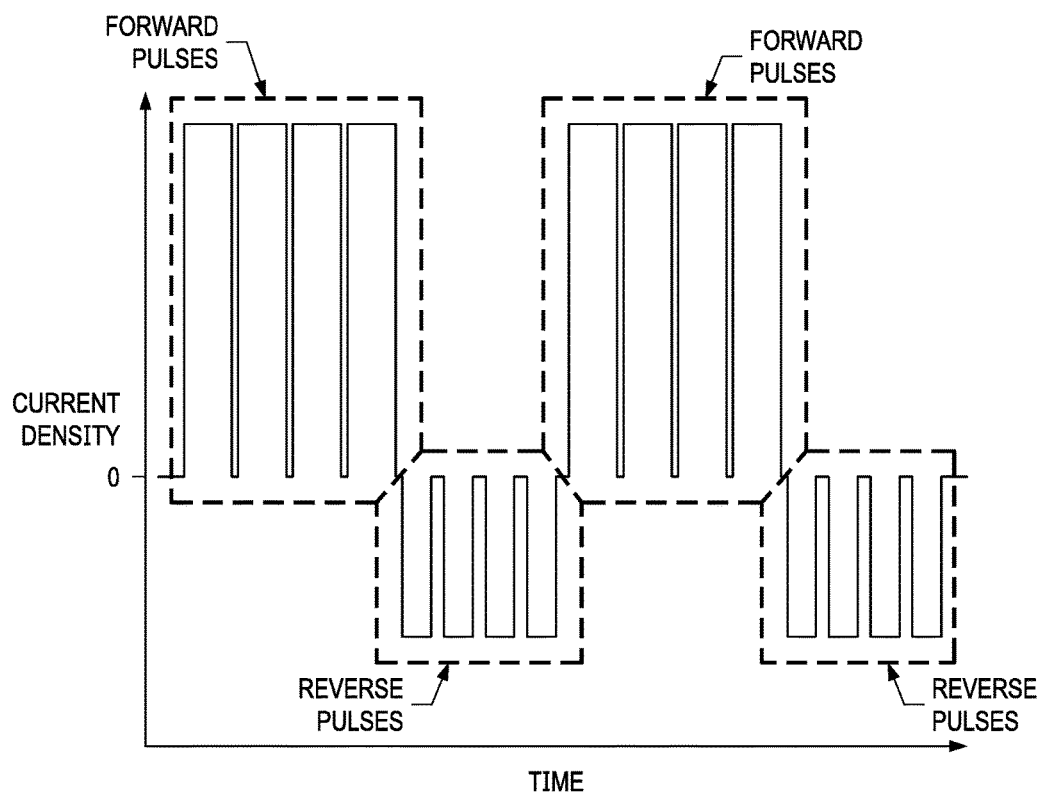
FIG. 3 depicts an example reverse pulse plating waveform.

FIG. 3 depicts an example reverse pulse plating waveform. The waveform depicts current density on the vertical axis as a function of time on the horizontal axis. In this example waveform, four forward pulses are applied, followed by four reverse pulses. A forward current density of the forward pulses may have a greater amplitude than a reverse current density of the reverse pulses, to provide a higher forward voltage between the barrier plating bath 230 and the copper pillars 214 of FIG. 2B, to plate the metals in the barrier plating bath 230 in a desired composition. The lower amplitude of the reverse current density of the reverse pulses may provide sufficient voltage between the barrier plating bath 230 and the copper pillars 214 to remove the tungsten and molybdenum in higher oxidation states, for example, $W^{+6}$ and $Mo^{+6}$, leaving a greater proportion of the nickel, cobalt, lanthanum, and cerium, having lower oxidation states, in the partially-formed barrier layer 216 of FIG. 2B. The forward current density may range from about 0.5 amps per square centimeter ($A/cm^2$) to about 1.0 $A/cm^2$, and the duration of each forward pulse may range from 10 milliseconds to 50 milliseconds, with a duty cycle of 75 percent to 100 percent, to provide a desired metal grain structure in the barrier layer 216. The reverse current density may be 35 percent to 60 percent of the forward current density, and the duration of the reverse pulses may range from 30 percent to 70 percent of the forward pulse duration, with a duty cycle of 60 percent to 100 percent, to provide a desired amount of tungsten and molybdenum in the diffusion barrier filler. The combination of the forward pulses followed by the reverse pulses is repeated to form the barrier layers 216 with a desired thickness.

Figure 2C:
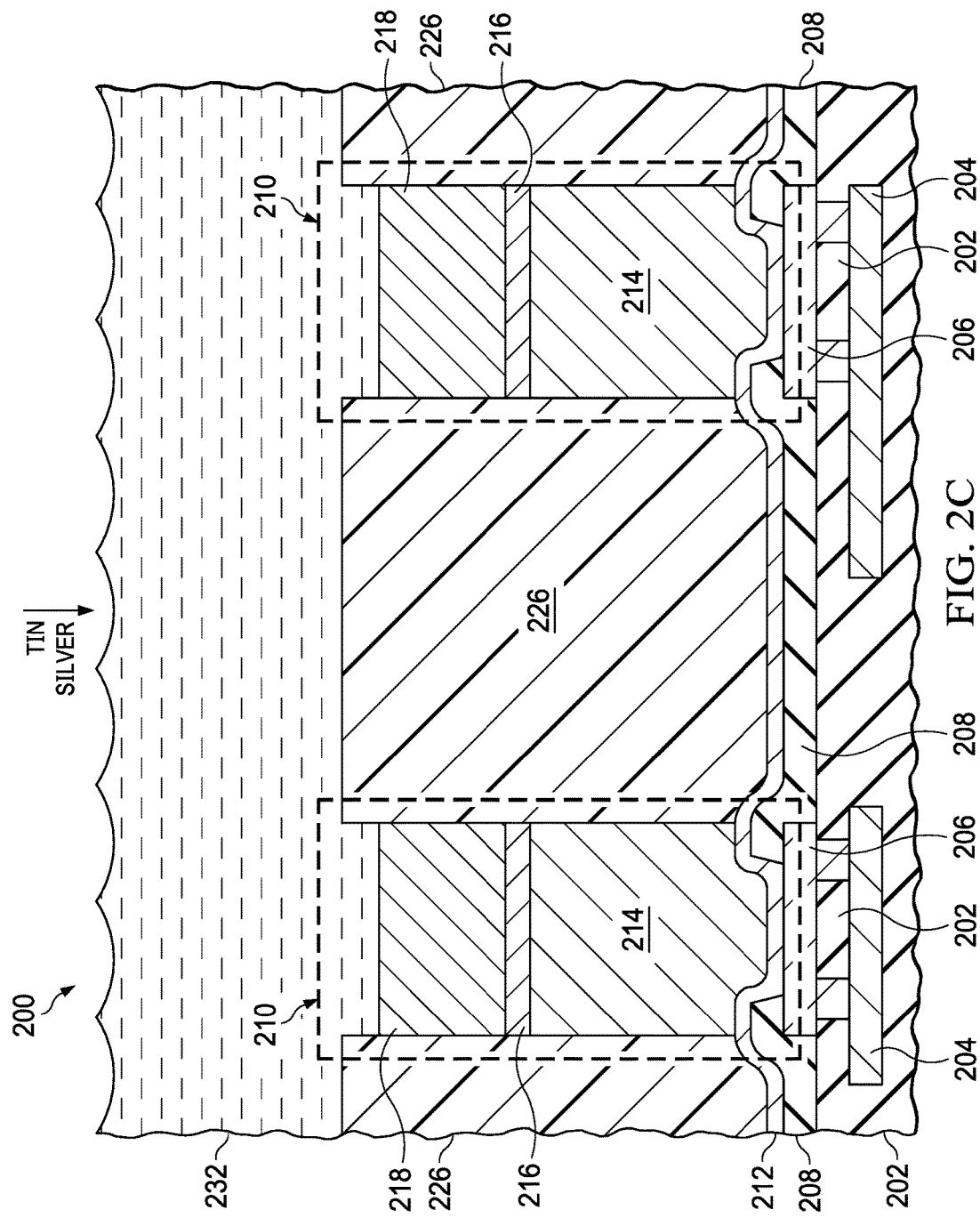

Referring to FIG. 2C, the plating mask 226 is left in place, and the barrier layers 216 are exposed to a solder plating bath 232. The solder plating bath 232 includes metals such as tin and silver, as indicated in FIG. 2C, and may include other metals, such as bismuth. The solder plating bath 232 may also include wetting agents, levelers, accelerators, or suppressors. Other formulations for the solder plating bath 232 are within the scope of the instant example. Current is flowed from the barrier layers 216 to the solder plating bath 232, resulting in solder being plated from the solder plating bath 232 onto the barrier layers 216 to form a solder bump 218 on the barrier layer 216 in each bump bond structure 210.

The plating mask 226 is subsequently removed, leaving the bump bond structures 210 in place. The plating mask 226 may be removed by dissolution in organic solvents or organic acids, or exposure to oxygen radicals or ozone, for example. After the plating mask 226 is removed, the UBM layer 212 is removed where exposed by the copper pillars 214, leaving the UBM layer 212 between the copper pillars 214 and the bond pads 206. The UBM layer 212 may be removed by a timed wet etch process, for example.

Figure 2D:
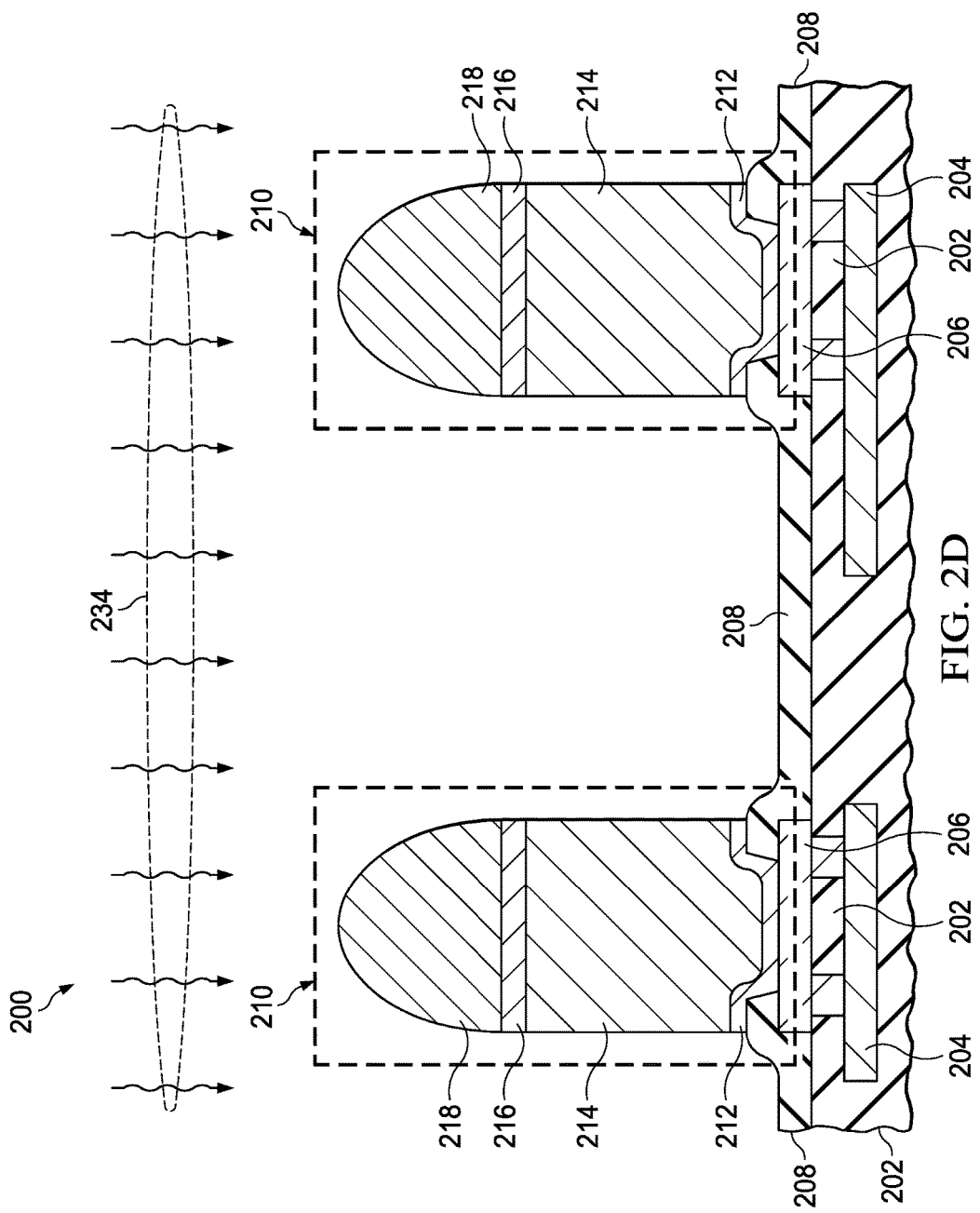

Referring to FIG. 2D, the bump bond structures 210 may optionally be heated to reflow the solder bumps 218. The bump bond structures 210 may be heated by a radiant heating process 234, as indicated in FIG. 2D. Alternatively, the bump bond structures 210 may be heated in a chain furnace or other process that heats an ambient contacting the bump bond structures 210. Reflowing the solder bumps 218 may require heating the solder bumps 218 to a temperature of 150° C. to 400° C., depending on the composition of the solder bumps 218. Reflowing the solder bumps 218 may provide a stronger connection between the solder bumps 218 and the barrier layers 216. The structure and composition of the barrier layers 216, as disclosed in reference to FIG. 1, may advantageously reduce formation of undesired intermetallic compounds of copper and tin and of nickel and tin, during the reflow of the solder bumps 218.

Figure 2E:
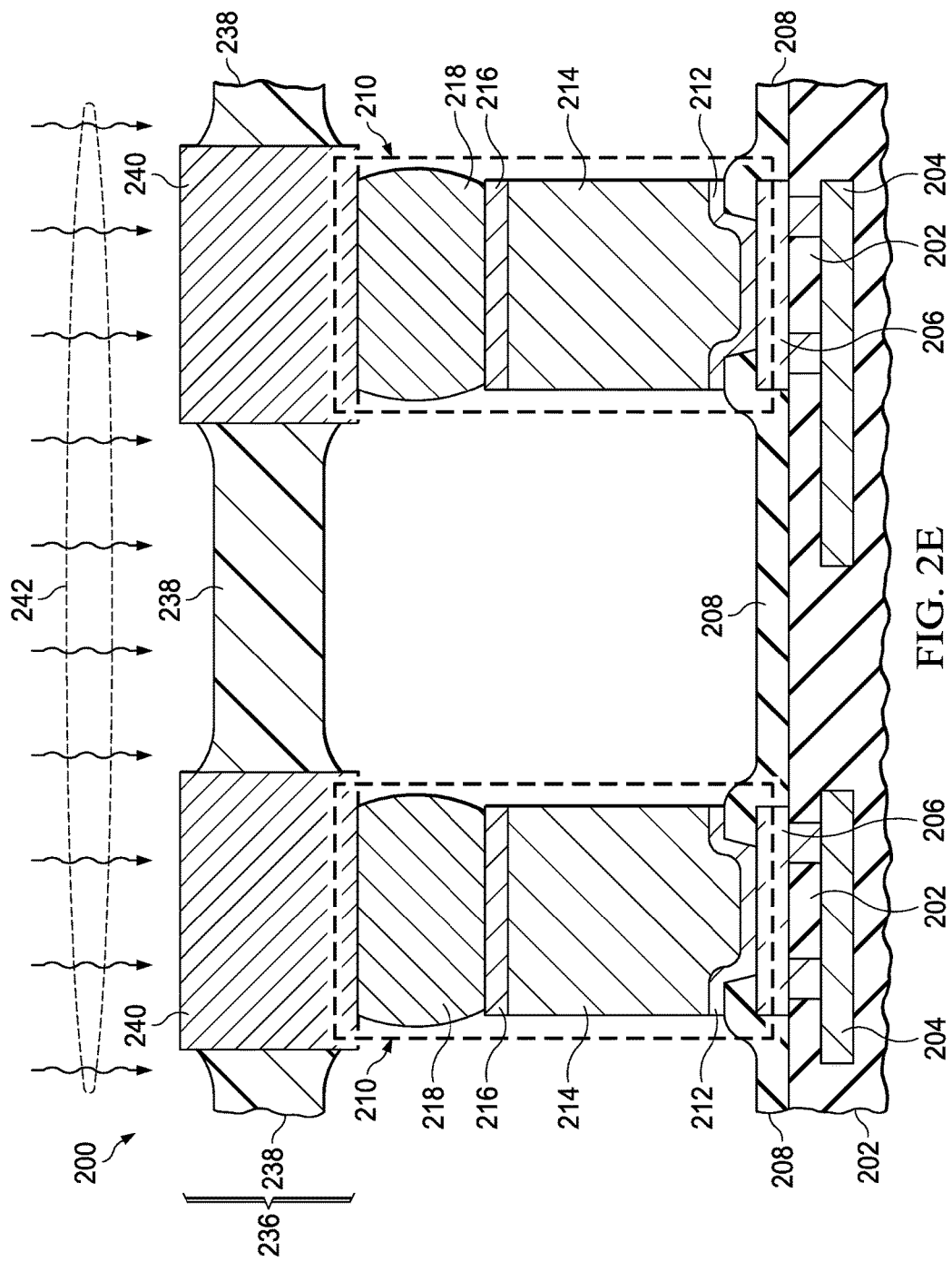

Referring to FIG. 2E, the microelectronic device 200 is bump bonded to a lead frame 236. The lead frame 236 may be, for example, a pre-molded lead frame 236 with mold compound 238 between metal terminals 240. The metal terminals 240 may include copper, for example. In the bump bonding process, the solder bumps 218 are heated to reflow the solder, to make solder connections to the metal terminals 240. The solder bumps 218 may be heated, for example, by a radiant heating process 242, as indicated in FIG. 2E, or by an ambient heating process such as a chain furnace process. Bump bonding the microelectronic device 200 to the lead frame 236 may require heating the solder bumps 218 to a temperature of 150° C. to 400° C., depending on the composition of the solder bumps 218. Pressure may optionally be applied to the microelectronic device 200 to assist the bump bonding process. The temperature required to bump bond the microelectronic device 200 to the lead frame 236 may be higher than the temperature required to reflow the solder bumps 218 as disclosed in reference to FIG. 2D. The structure and composition of the barrier layers 216 may advantageously reduce formation of undesired intermetallic compounds of copper and tin and of nickel and tin, during the bump bonding process. The structure and composition of the barrier layers 216 may further reduce formation of brittle intermetallic compounds of nickel and tin, which may improve reliability of the bump bond structures 210 during mechanical and thermal stress between the lead frame 236 and the microelectronic device 200.

Figure 4A:
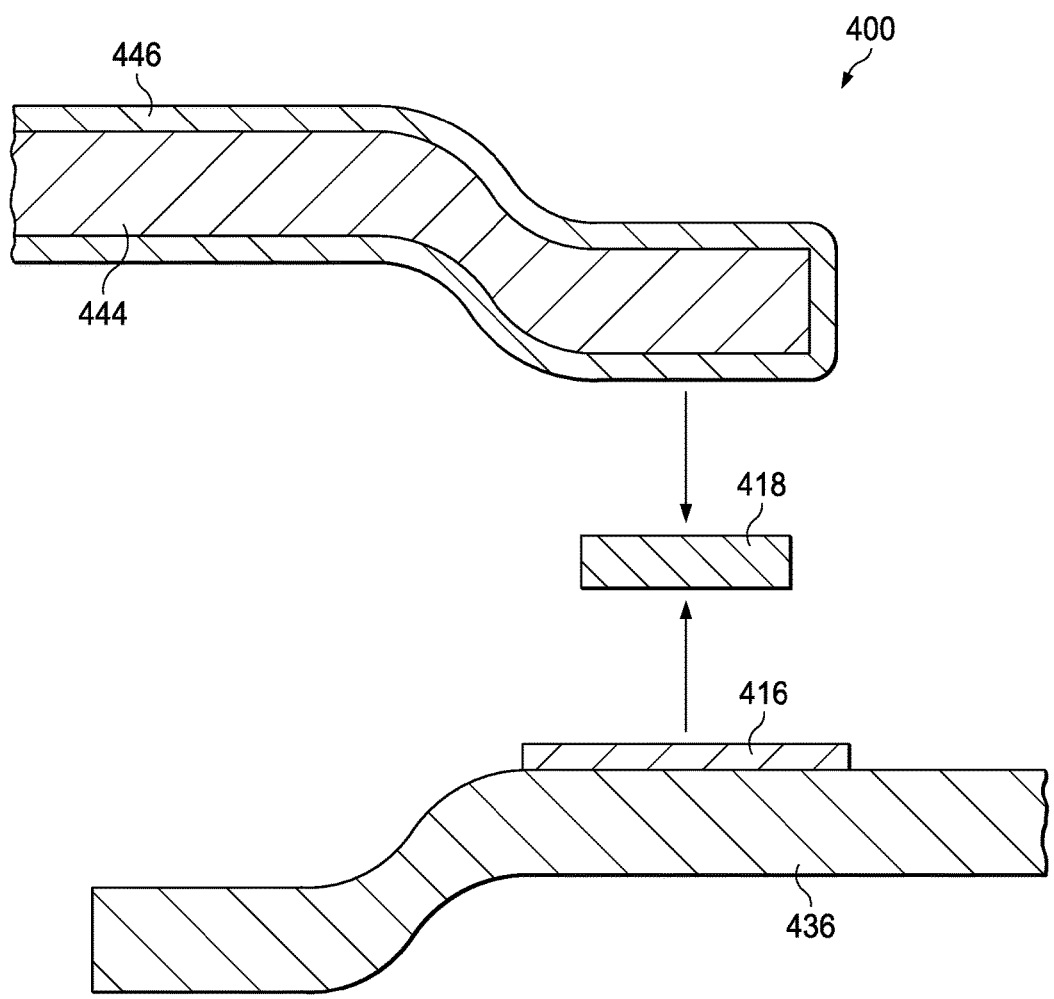
FIG. 4A and FIG. 4B depict a microelectronic device having a lead frame including a barrier layer, depicted in stages of an example method of formation.
Figure 4B:
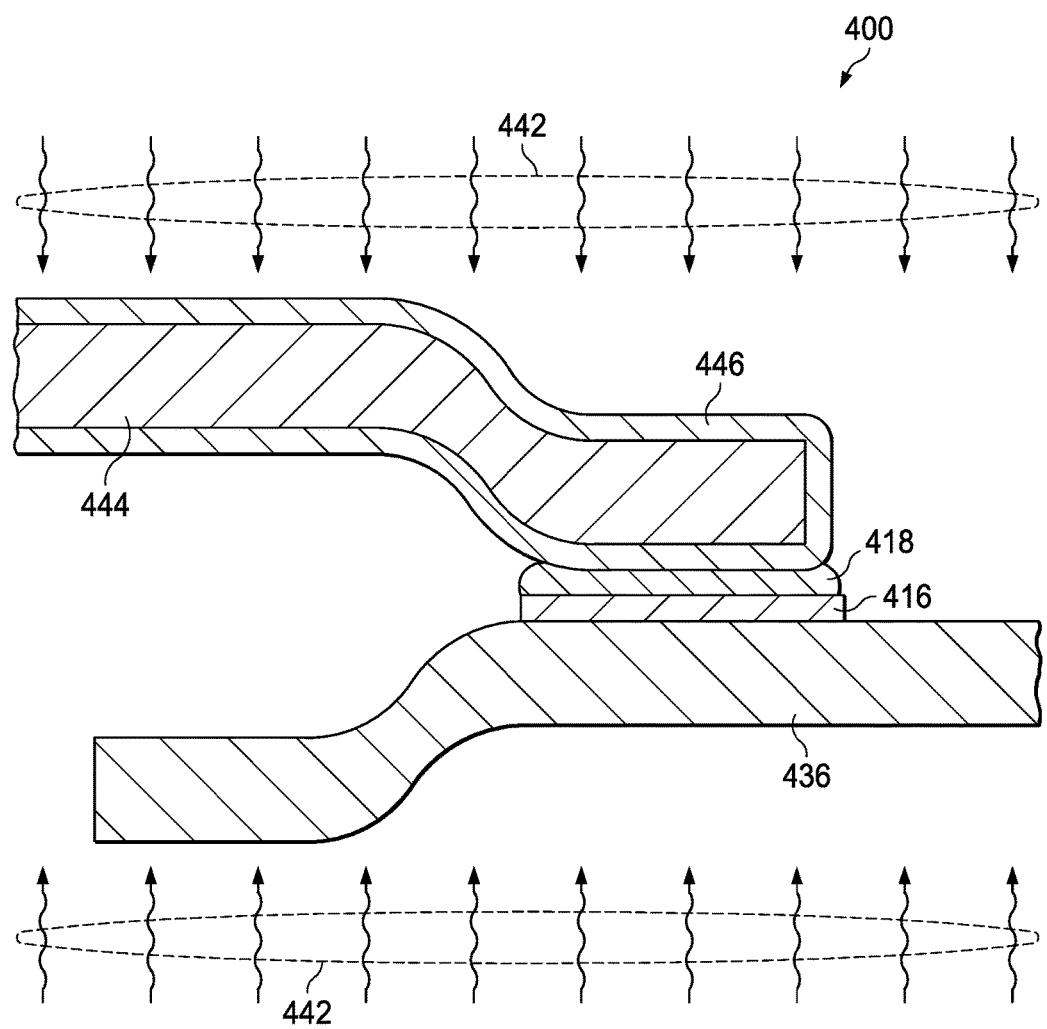

FIG. 4A and FIG. 4B depict a microelectronic device having a lead frame including a barrier layer, depicted in stages of an example method of formation. Referring to FIG. 4A, the microelectronic device 400 includes the lead frame 436. In the instant example, the lead frame 436 may include primarily copper. A first barrier layer 416 is formed on the lead frame 436 to cover an area on the lead frame 436 for a solder connection. The first barrier layer 416 may be formed by a plating process, for example, as disclosed in reference to FIG. 2B and FIG. 2C. Other processes for forming the first barrier layer 416, such as direct current (DC) electroplating, or electroless plating, are within the scope of the instant example. The first barrier layer 416 has the structure and composition as disclosed in reference to FIG. 1. The first barrier layer 416 may be localized to the area for the solder connection, as depicted in FIG. 4A, or may cover the lead frame 436.

The microelectronic device 400 further includes a clip 444 with a second barrier layer 446. The second barrier layer 446 covers an area on the clip 444 for the solder connection. The second barrier layer 446 may have a structure and composition similar to the first barrier layer 416, and may be formed by a similar process.

The microelectronic device 400 further includes a solder material 418 for the solder connection. The solder material 418 may be manifested as a solder preform or a solder paste, for example. The solder material 418 may include tin, silver, bismuth, or other metals.

The microelectronic device 400 is formed by contacting the lead frame 436 to the solder material 418 through the first barrier layer 416, and contacting the clip 444 to the solder material 418 through the second barrier layer 446, as indicated in FIG. 4A.

Referring to FIG. 4B, the microelectronic device 400 is heated, causing the solder material 418 to reflow and make the solder connection between the lead frame 436 and the clip 444. The microelectronic device 400 may be heated by a radiant heat process 442 as indicated in FIG. 4B, or by a furnace process.

The structure and composition of the first barrier layer 416 may advantageously reduce formation of undesired intermetallic compounds of copper and tin and of nickel and tin, during the solder reflow process. The structure and composition of the first barrier layer 416 may further reduce formation of brittle intermetallic compounds of nickel and tin, which may improve reliability of the microelectronic device 400 during mechanical and thermal stress between the lead frame 436 and the clip 444. In versions of the instant example in which the second barrier layer 446 has a structure and composition similar to the first barrier layer 416, the same advantages may accrue.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:
1. A microelectronic device, comprising:
   a reflow structure, including:
      a copper-containing member;
      a barrier layer on the copper-containing member, the barrier layer including metal grains and a diffusion barrier filler between the metal grains; and
      a solder member on the barrier layer, the solder member having a reflow temperature between 150° C. and 400° C.;
   wherein:
      the metal grains include at least 10 weight percent of a first metal selected from the group consisting of nickel, cobalt, lanthanum, and cerium;

the metal grains include at least 10 weight percent of a second metal, different from the first metal, selected from the group consisting of nickel, cobalt, lanthanum, and cerium; and the barrier layer includes at least one metal selected from the group consisting of tungsten and molybdenum, wherein a combined concentration of tungsten and molybdenum in the barrier layer is greater than 2 weight percent and less than 15 weight percent, and wherein a combined concentration of tungsten and molybdenum in the diffusion barrier filler is higher than a combined concentration of tungsten and molybdenum in the metal grains.

2. The microelectronic device of claim 1, wherein:
the metal grains include at least 10 weight percent of nickel;
the metal grains include at least 10 weight percent of cobalt; and
the metal grains include less than 1 weight percent lanthanum and cerium.

3. The microelectronic device of claim 1, wherein the barrier layer includes less than 1 weight percent molybdenum.

4. The microelectronic device of claim 1, wherein the barrier layer is 2 microns to 20 microns thick.

5. The microelectronic device of claim 1, wherein:
the reflow structure is a bump bond structure;
the copper-containing member is a copper-containing pillar; and
the solder member is a solder bump.

6. The microelectronic device of claim 1, wherein the reflow structure is a solder connection on a lead frame, and the copper-containing member is a copper-containing terminal of the lead frame.

7. The microelectronic device of claim 1, wherein the solder includes at least 25 weight percent tin.

8. The microelectronic device of claim 1, wherein the reflow structure includes an intermetallic compound between the barrier layer and the solder member, the intermetallic compound including a metal from the solder member and at least two metals from the metal grains.

9. The microelectronic device of claim 8, wherein the intermetallic compound is more malleable than $Ni_3Sn_4$.

10. The microelectronic device of claim 1, wherein the reflow structure is free of an intermetallic compound including copper and tin.

11. A method of forming a microelectronic device, comprising:
providing a copper-containing member;
providing a barrier plating bath, the barrier plating bath including:
a first metal selected from the group consisting of nickel, cobalt, lanthanum, and cerium;
a second metal, different from the first metal, selected from the group consisting of nickel, cobalt, lanthanum, and cerium; and
a third metal selected from the group consisting of tungsten and molybdenum;
forming a barrier layer on the copper-containing member by concurrently plating the first metal, the second metal, and the third metal from the barrier plating bath onto the copper-containing member, the barrier layer including metal grains and a diffusion barrier filler between the metal grains; and
forming a solder member on the barrier layer, the solder member having a reflow temperature between 150° C. and 400° C.;

wherein:
the metal grains include at least 10 weight percent of a first metal and at least 10 weight percent of a second metal, different from the first metal, wherein the first metal and the second metal are each selected from the group consisting of nickel, cobalt, lanthanum, and cerium;
a combined concentration of tungsten and molybdenum in the barrier layer is greater than 2 weight percent and less than 15 weight percent; and
a combined concentration of tungsten and molybdenum in the diffusion barrier filler is higher than a combined concentration of tungsten and molybdenum in the metal grains.

12. The method of claim 11, wherein the barrier plating bath includes nickel and cobalt, and is essentially free of lanthanum and cerium.

13. The method of claim 11, wherein the barrier plating bath includes tungsten, and is essentially free of molybdenum.

14. The method of claim 11, wherein concurrently plating the first metal, the second metal, and the third metal is performed using a reversed pulse plating process, in which a magnitude of a forward current density is greater than a magnitude of a reverse current density, wherein the first meal, the second metal and the third metal are plated from the barrier plating bath by the forward current density, and metal is removed from the barrier layer by the reverse current density.

15. The method of claim 11, wherein:
the copper-containing member is a copper-containing pillar;
providing the copper-containing pillar includes plating copper onto an under bump metallization (UBM) layer;
the solder member is a solder bump; and
forming a solder member includes plating the solder bump onto the barrier layer.

16. The method of claim 11, wherein the copper-containing member is a copper-containing terminal of a lead frame.

17. A method of forming a microelectronic device, comprising:
providing a reflow structure, including:
a copper-containing member;
a barrier layer on the copper-containing member, the barrier layer including metal grains and a diffusion barrier filler between the metal grains; and
a solder member on the barrier layer, the solder member having a reflow temperature between 150° C. and 400° C.;
wherein:
the metal grains include at least 10 weight percent of a first metal selected from the group consisting of nickel, cobalt, lanthanum, and cerium;
the metal grains include at least 10 weight percent of a second metal, different from the first metal, selected from the group consisting of nickel, cobalt, lanthanum, and cerium; and
the barrier layer includes at least one metal selected from the group consisting of tungsten and molybdenum;
a combined concentration of tungsten and molybdenum in the barrier layer is greater than 2 weight percent and less than 15 weight percent; and
a combined concentration of tungsten and molybdenum in the diffusion barrier filler is higher than a combined concentration of tungsten and molybdenum in the metal grains; and heating the reflow structure above the reflow temperature, so that the solder member forms a connection between the barrier layer and a member of the microelectronic device.

18. The method of claim 17, wherein:

the reflow structure is a bump bond structure;

the copper-containing member is a copper-containing pillar; and the solder member is a solder bump.

19. The method of claim 17, wherein the reflow structure is a solder connection on a lead frame, and the copper-containing member is a copper-containing terminal of the lead frame.

20. The method of claim 17, wherein:

the metal grains include at least 10 weight percent of nickel;

the metal grains include at least 10 weight percent of cobalt;

the metal grains include less than 1 weight percent lanthanum and cerium; and the barrier layer less than 1 weight percent molybdenum.

\* \* \* \* \*